United States Patent [19]

Van Stapele et al.

[11] Patent Number: 4,987,369

[45] Date of Patent: Jan. 22, 1991

[54] METHOD OF AND DEVICE FOR THE VOLUME-SELECTIVE DETERMINATION OF AND MR SPECTRUM BY MEANS OF SELECTIVE POLARIZATION TRANSFER PULSE SEQUENCES

[75] Inventors: Reurt P. Van Stapele; Arend Heerschap; Jan A. Den Hollander, all of Eindhoven, Netherlands

[73] Assignee: U.S. Philips Corporation, New York, N.Y.

[21] Appl. No.: 361,204

[22] Filed: Jun. 5, 1989

[30] Foreign Application Priority Data

Jun. 22, 1988 [NL] Netherlands ............... 8801588

[51] Int. Cl.$^5$ .................................. G01R 33/20
[52] U.S. Cl. ........................................ 324/307
[58] Field of Search ............... 324/300, 307, 308, 309, 324/311, 312, 313, 314

[56] References Cited

U.S. PATENT DOCUMENTS

| | | | |
|---|---|---|---|
| 4,345,207 | 8/1982 | Bertrand | 324/308 |
| 4,521,732 | 6/1985 | Pegg et al. | 324/308 |
| 4,682,107 | 7/1987 | Bendall et al. | 324/308 |
| 4,701,708 | 10/1987 | Hardy et al. | 324/308 |
| 4,843,321 | 6/1989 | Sotak | 324/311 |
| 4,866,387 | 9/1989 | Hyde et al. | 324/318 |

OTHER PUBLICATIONS

Guerin, High Resolution NMR Spectroscopy of Polymers and Copolymers of Malic Acid and its Benzyl- and Methylesters; assignment and structural analysis by using the SINEPT Sequence., Jun. 1989, vol. 10, p. 301.

R. Kimmich et al., "Volume-Selective Multipulse Spin-Echo Spectroscopy", Journal of Magnetic Resonance, vol. 72, 1987, pp. 379–384.

D. G. Norris et al., "INEPT14 Enhanced $^{13}$C Spectroscopy Using Double-Tuned Surface Coils", Journal of Magnetic Resonance, vol. 78, 1988, pp. 362–366.

M. Saner et al., "In Vivo $^{13}$C Spectroscopy Using Polarization Transfer for Sensitivity Enhancement", Book of Abstracts of the Society for Magnetic Resonance in Medicine, 1988, p. 65.

W. P. Aue et al., Localized $^{13}$C NMR Spectra with Enhanced Sensitivity Obtained by Volume-Selective Excitation, Journal of Magnetic Resonance, pp. 392–395 (1985).

G. A. Morris et al., Enhancement of Nuclear Magnetic Resonance Signals by Polarization Transfer, Journal of the American Chemical Society 101:3, 760–762 (1/79).

*Primary Examiner*—Michael J. Tokar
*Attorney, Agent, or Firm*—Jack D. Slobod

[57] ABSTRACT

Polarization transfer pulse sequences in NMR, such as a DEPT pulse sequence, in combination with a volume selection (for example, VSE) in a body have been described. Therein first volume selection is performed in the body by means of VSE, after which the body is exposed to the DEPT pulse sequence. According to the present invention it is proposed to make the volume selection coincide with the polarization transfer pulse sequence, so that inter alia the pulse sequence is less susceptible to imperfections of rf electromagnetic pulses.

20 Claims, 3 Drawing Sheets

METHOD OF AND DEVICE FOR THE VOLUME-SELECTIVE DETERMINATION OF AND MR SPECTRUM BY MEANS OF SELECTIVE POLARIZATION TRANSFER PULSE SEQUENCES

BACKGROUND OF THE INVENTION

1. Field of the Invention

The invention relates to a method of determining a spectrum from at least one magnetic resonance signal which is generated in a volume part of a body which contains a first and a second type of nucleus and which is arranged in a steady, uniform magnetic field, the resonance signal being obtained by polarization transfer from nuclear spins of the first type of nucleus to nuclear spind of the second type of nucleus in a first and a second pulse sequence of rf electromagnetic pulses, which pulse sequences coincide at least partly, the first pulse sequence containing a first, a second and a third rf pulse, the second pulse sequence containing a fourth and a fifth rf pulse, the pulses being separated from one another by waiting periods.

The invention also relates to a device for determining a spectrum from at least one magnetic resonance signal, which device comprises means for generating a steady, uniform magnetic field, means for generating, utilizing rf electromagnetic pulses, resonance signals in a volume part of a body by polarization transfer from nuclear spins of a first type of nucleus in the body to nuclear spins of a second type of nucleus in the body, means for generating at least one magnetic field gradient, means for receiving, detecting and sampling the magnetic resonance signal, and display means for displaying the spectrum, and also comprises processing means which include programmed arithmetic means for determining the spectrum from the sampling values obtained by means of the sampling means.

2. Description of the Prior Art

A method of this kind is known from the article "Localized $^{13}$C NMR Spectra with Enhanced Sensitivity Obtained by Volume-Selective Excitation", W.P. Aue e.a., Journal of Magnetic Resonance 61, pp. 392-395, 1985. According to such a method a body to be examined is arranged in a steady, uniform magnetic field $B_0$. The body contains a first type of nucleus, for example a proton $^1$H, and a second type of nucleus, for example a carbon isotope $^{13}$C. According to said method, first a volume part of the body is selected on the basis of nuclear spins of protons for which suitable localization of proton magnetization can be achieved within the volume part because of the small chemical shift range of bound protons, after which polarization transfer is applied in order to transfer the localized proton magnetization to the $^{13}$C nuclei coupled to the protons within the same volume part. In comparison with conventional $^{13}$C spectroscopy, this offers the advantage that the sensitivity is increased and the localization of the so-called $^{13}$C sensitive volume is more accurate. For the polarization transfer after the volume selection, the body is exposed to a first and a second pulse sequence of rf electromagnetic pulses. The first pulse sequence, acting on $^1$H, successively comprises an rf pulse (90°), a second rf pulse (180°) and a third rf pulse (having a pulse angle to be varied). The second pulse sequence, acting on $^{13}$C, comprises a fourth rf pulse (90°) and a fifth rf pulse (180°). The pulses for $^1$H and $^{13}$C are applied to the body via separate transmitter coils in a device for determining a spectrum from at least one magnetic resonance signal. The fourth rf pulse coincides with the second rf pulse and the fifth rf pulse coincides with the third rf pulse. The waiting periods between the pulses amount to $(2J)^{-}$s in said article, where J is a coupling constant between nuclear spins of the first and the second type. After a waiting period $(2J)^{-}$ subsequent to the fifth rf pulse, a resonance signal is obtained for bound $^{13}$C, which signal provides a spectrum after sampling and Fourier transformation. In order to achieve an adequate signal-to-noise ratio, it will be necessary to average a large number of resonance signals. The volume selection on protons is performed with VSE (Volume Selective Excitation), being a pulse gradient sequence in which three magnetic field gradients $G_x$, $G_y$ and $G_z$ in an xyz-coordinate system are successively activated, the field direction thereof being coincident with the direction of the field $B_0$, their gradient directions extending mutually perpendicularly, combined selective and non-selective rf pulses being applied during the application of the gradient (45° selective, 90° non-selective and 45° selective). The first gradient $G_x$ selects a slice of the body (longitudinal magnetization exists only within the slice); the second gradient $G_y$ selects a bar within the slice and, finally, the third gradient $G_z$ selects an xyz volume part of the body. The method can be used for a $CH_n$ spin system, i.e. a body which contains molecules with CH, $CH_2$ and $CH_3$ groups. Because of the large number of resonance signals required, the overall measuring time required for determining a spectrum will be substantial.

SUMMARY OF THE INVENTION

The invention inter alia aims to provide a simpler and more flexible pulse sequence.

A method in accordance with the invention is characterized in that the volume part is selected during the application of the rf pulses by utilizing at least a first slice-selective field gradient which coincides with the first rf pulse. As a result the pulse sequence is also less susceptible to imperfections of rf electromagnetic pulses and the overall measuring time can be reduced.

A version of a method in accordance with the invention is characterized in that the selection of the volume part is further realized by applying a second and a third slice-selective field gradient which coincide with the second and the third rf pulse, respectively, the first, the second and the third field gradient restricting respective excitations of nuclear spins to mutually intersecting slices. The excitations of the nuclear spins will be restricted to a first, a second and a third slice, respectively. A volume is selected by the intersection of the slices. When the gradients are selected to extend mutually perpendicularly, an orthogonal volume will be selected. The frequency contents of the rf pulses and the intensity of the field gradients will be chosen as a function of the spin system to be examined. This will be elaborated hereinafter with reference to a CH spin system. The rf pulses for $^1$H and $^{13}$C can be applied by means of transmitter coils in the form of respective body coils.

A version of a method in accordance with the invention is characterized in that the selection of the volume part further takes place by applying the fourth and the fifth rf pulse by means of a surface coil, the first gradient selecting a slice extending perpendicularly to an axis of the surface coil. The first field gradient may be a linear combination of the gradients $G_x$, $G_y$ and $G_z$ in order to obtain a gradient direction which selects a slice extending perpendicularly to the axis of the surface coil. The first rf pulse is rendered slice-selective on the $^1$H nuclear spins in this slice. The fourth and the fifth rf pulse, applied to the body by means of the surface coil, impose a location-dependent rotation of a $^{13}$C magnetization vector in a coordinate system x'y'z' which rotates at a $^{13}$C precessional frequency. The fourth and the fifth rf pulse should be selected so that 180° and 90° rotation, respectively, of the $^{13}$C magnetization vector are obtained in the selected slice. The first, the second and the third pulse are applied by means of a body coil. The body coil and the surface coil should be decoupled from one another. It is to be noted that European patent application EP 0 155 978 discloses a coarse method of localization for polarization transfer sequences. However, this approach does not involve the use of gradients. Localization is realized by overlapping of so-called sensitive volumes which are formed in that the first, the second and the third pulse on $^1$H nuclear spins are applied via a first surface coil, the fourth and the fifth rf pulse on $^{13}$C nuclear spins being applied via a second surface coil, said surface coils having a different diameter and being situated in the same plane.

A version of a method in accordance with the invention is characterized in that the waiting period elapsing between the fourth and the third rf pulse amounts to an odd number of times $(2J)^{-1}$ s, where J is a coupling constant between nuclear spins of the first type and the second type, the other waiting periods elapsing between the rf pulses themselves and the waiting periods elapsing until acquisition of the resonance signal takes place being larger than or equal to the odd number of times $(2J)^{-1}$s. This involves a so-called DEPT sequence (Distortionless Enhancement by Polarization Transfer) where all waiting periods can be selected to be, for example $(2J)^{-1}$ s, i.e. a normal DEPT sequence. Alternatively, the waiting period between the third and the fourth rf pulse may be chosen so that it equals an odd number of times $(2J)^{-1}$, the other waiting periods being chosen so as to be longer; this is more attractive from a point of view of practical realization of the sequence. In the latter case the rf pulses on the $^1$H nuclear spins will no longer coincide with the rf pulses on the $^{13}$C nuclear spins. As a result, broadband $^{13}$C pulses can also be applied more readily, because in that case no gradient is switched during the $^{13}$C pulses; the gradients are switched during the pulses on the $^1$H nuclear spins. In the case of $^{13}$C spectra which do not involve polarization transfer, broadband $^{13}$C pulses could cause localization problems because of a comparatively large chemical shift of $^{13}$C. When the $^1$H and $^{13}$C pulses are not simultaneously applied, localization takes place on the $^1$H nuclear spins and this problem will not occur. It is to be noted that it is sometimes sufficient to study a smaller part of the $^{13}$C spectrum. In that case $^{13}$C pulses having a smaller bandwidth suffice.

A version of a method in accordance with the invention is characterized in that, in order to suppress signals originating from coupled nuclei of the first and the second type from outside the selected volume part and from non-coupled nuclei of the second type, phase cycling is applied to at least one rf pulse, the spectrum being determined from resonance signals obtained with opposite phase. In the case of a $CH_n$ spin system, signals from $CH_n$ groups outside the selected volume part cannot be ignored. By subtracting the resonance signals obtained with opposite phase, from one another, such undesirable signals are eliminated. The latter approach, however, is susceptible to motions of the body so that it is of significance for in vivo spectroscopy.

A version of a method in accordance with the invention is characterized in that the first and the second pulse sequence are preceded by an rf saturation pulse which acts on the nuclear spins of the second type, followed by a dephasing gradient. The effect of motion is strongly reduced as a result of the improved suppression of undesirable signals. It is to be ensured that the first rf pulse is applied well within the longitudinal relaxation time $T_1$.

A version of a method in accordance with the invention is characterized in that the saturation pulse is a 90° rf pulse of the adiabatic fast passage type. Adiabatic fast passage implies a fast sweep of the frequency of an rf pulse through the spin resonance frequency in order to rotate the magnetization through a given angle.

A version of a method in accordance with the invention is characterized in that within a longitudinal relaxation time of a magnetization for a volume selected by means of at least one slice-selective field gradient, resonance signals are generated at least in one volume, shifted with respect to said volume, by means of rf pulse sequences which correspond to the first and the second pulse sequence. The waiting time elapsing for longitudinal relaxation is utilized for the measurement of other volumes, a so-called "multiple volume technique".

DETAILED DESCRIPTION OF THE PREFERRED EMBODIMENTS

Figure 1:
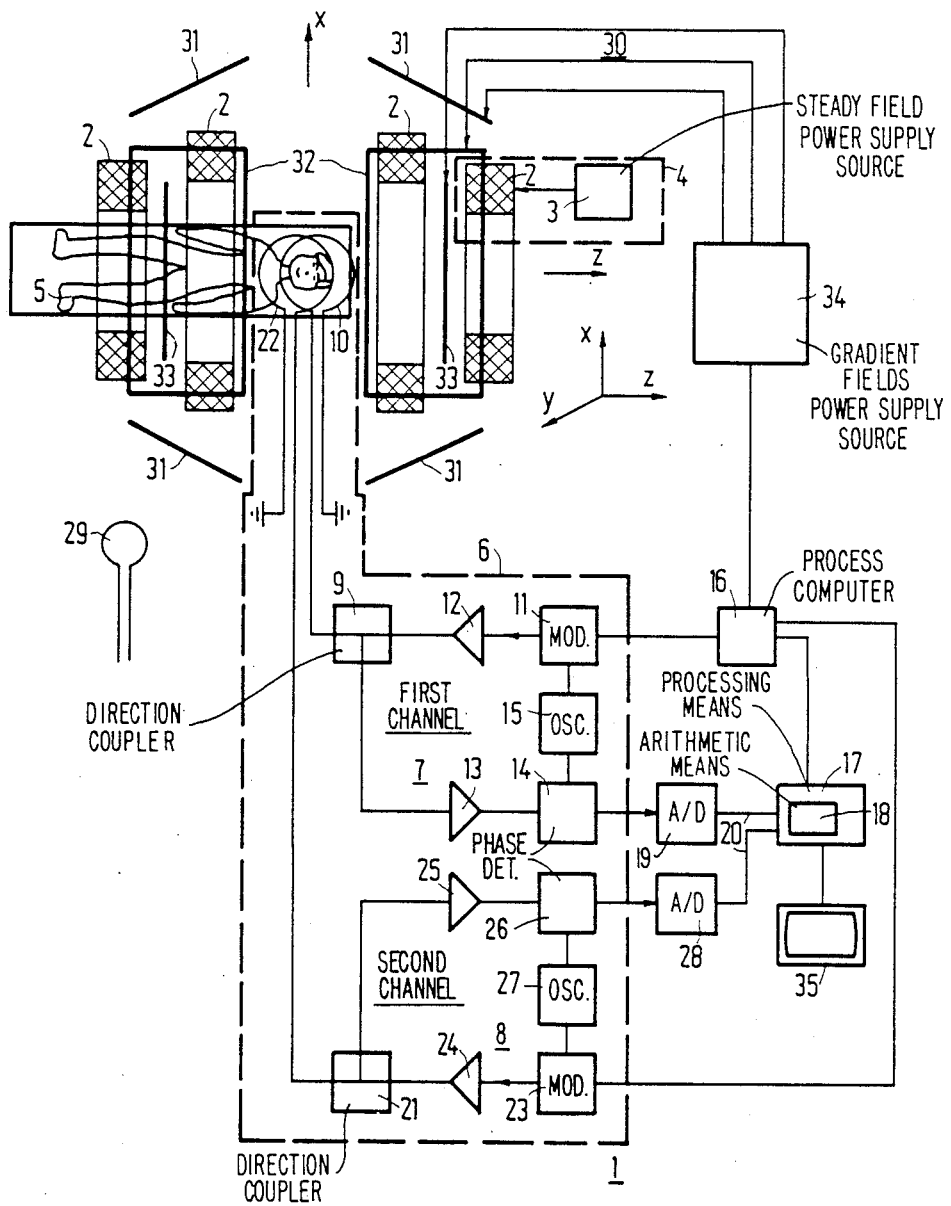
Figure 2A:
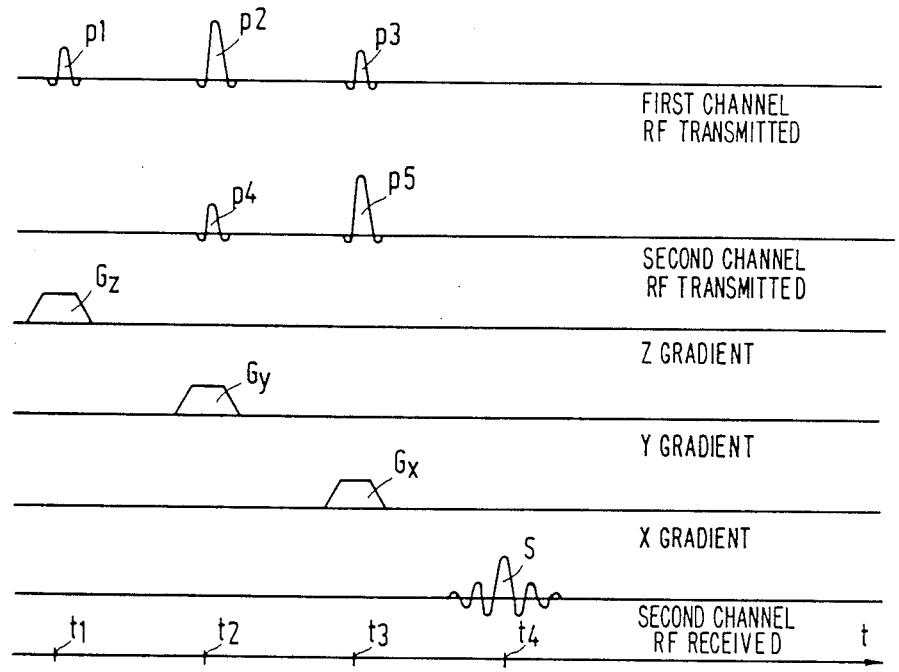
Figure 2B:
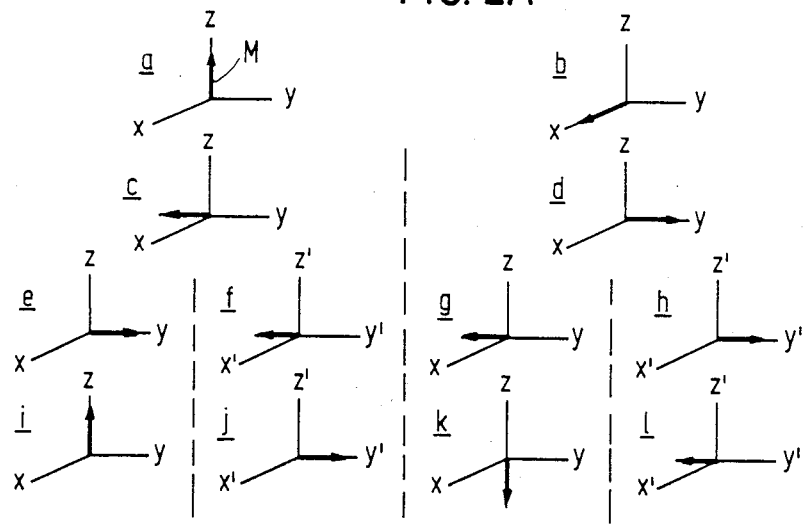
Figure 3:
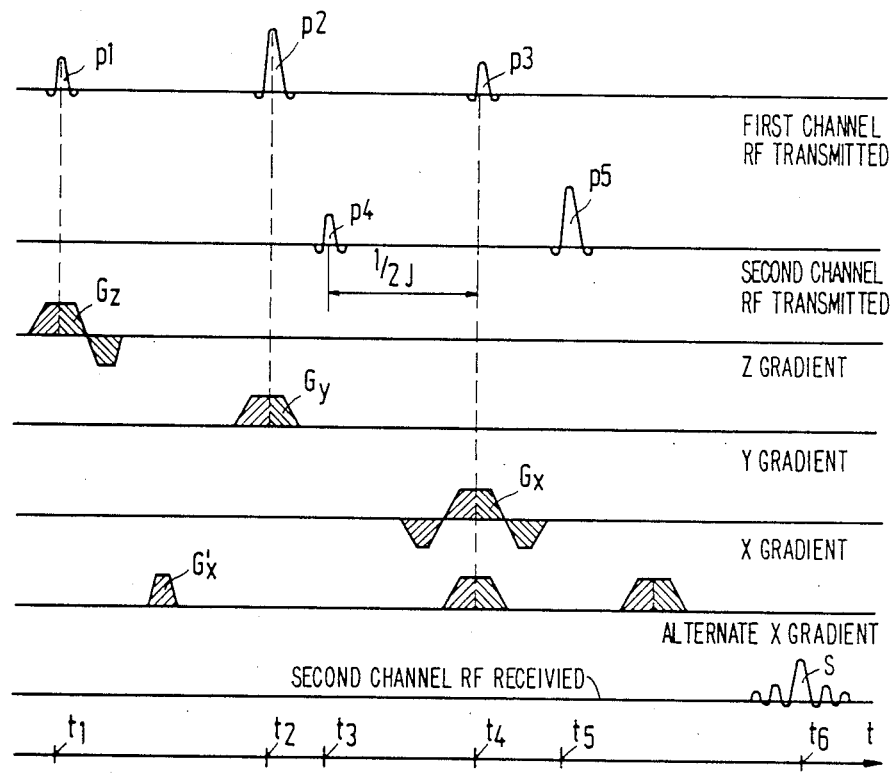

The invention will be described in detail hereinafter with reference to a drawing; therein FIG. 1 diagrammatically shows a device in accordance with the invention, FIG. 2A illustrates a DEPT pulse sequence in accordance with the invention, FIG. 2B is a vector description of the DEPT pulse sequence in accordance with the invention in a double rotating coordinate system, and FIG. 3 shows a modified DEPT pulse sequence in accordance with the invention.

DETAILED DESCRIPTION OF THE PREFERRED EMBODIMENTS

FIG. 1 diagrammatically shows a device 1 in accordance with the invention. The device 1 comprises magnet coils 2 and, in the case of resistive magnets or superconducting magnets, a d.c. power supply source 3. The magnet coils 2 and the d.c. power supply source 3 constitute means for 4 generating a steady, uniform magnetic field $B_0$. When the magnet coils 2 are constructed as permanent magnets, the d.c. power supply source 3 will be absent. A body 5 can be arranged within the magnet coils 2. The body 5 may contain nuclear spins of a first type of nucleus and nuclear spins of a second type of nucleus which may be coupled to one another, for example in a $CH_n$ group of a molecule in which C is a $^{13}$C carbon isotope and H is a $^1$H proton. The coupling can be expressed by means of a coupling constant $J_{CH}s^{-1}$. During operation of the device 1 with the body 5 arranged within the magnet coils 2, a small excess of nuclear spins (of nuclei having a magnetic moment) will be oriented in the same direction as the field $B_0$ in a state of equilibrium. From a macroscopic point of view this is to be considered as a magnetization M, being an equilibrium magnetization. The device 1 also comprises means for generating, utilizing rf electromagnetic pulses, for example resonance signals in a volume part of the body 5 by polarization transfer of nuclear spins of the first type in the body 5 to nuclear spins of the second type in the body 5. The means 6 comprise a first transmitter/receiver channel 7 and a second transmitter/receiver channel 8. The first transmitter/receiver channel 7 is coupled, via a directional coupler 9, to a first coil 10 for transmitting rf electromagnetic pulses and for receiving magnetic resonance signals. The first transmitter/receiver channel 7 comprises a modulator 11, an amplifier 12, an amplifier 13, a phase sensitive detector 14, and an oscillator 15 for generating a carrier signal. The modulator 11 is controlled by a process computer 16 which is coupled to processing means 17 which include programmed arithmetic means 18. A magnetic resonance signal received via the first transmitter/receiver channel 7 is demodulated in the phase sensitive detector 14 and the demodulated signal is applied to an A/D converter 19 whereby signal sampling is performed (in the case of quadrature detection there is provided a further A/D converter (not shown)). Sampling values 20 can be applied to the processing means 17. The second transmitter/receiver channel 8 has an identical construction and comprises a directional coupler 21, a transmitter/receiver coil 22, a modulator 23, an amplifier 24, an amplifier 25, a phase sensitive detector 26, and an oscillator 27. The phase sensitive detector 26 is coupled to an A/D converter 28 which is coupled to the processing means 17 (in the case of quadrature detection, the channel 8 also comprises a further A/D converter). When the device 1 is used to generate pulse sequences for realizing polarization transfer, the oscillator 15 will be tuned to the spin resonance of the first type of nucleus and the oscillator 27 will be tuned to the spin resonance of the second type of nucleus. Via the first transmitter/receiver channel 7, in a first pulse sequence rf pulses are applied to the coil 10 in order to be applied to the body 5 and, via the second transmitter/receiver channel 8, in a second pulse sequence rf pulses are applied to the coil 22, again in order to be applied to the body 5. The programmed arithmetic means are suitable for making the first and the second pulse sequence coincide at least partly. The oscillators 15 and 27 can be controlled by the process computer 16. The coil 22, being a so-called body coil, can be replaced by a surface coil 29 whereby the body 5 can be locally irradiated. The body coil 22 is arranged in a stationary position within the device 1, the surface coil 29 being displaceable. The device 1 also comprises means 30 for generating magnetic field gradients which are superposed on the field $B_0$. The means 30 comprise gradient magnet coils 31 for generating a magnetic field gradient $G_x$, gradient magnet coils 32 for generating a magnetic field gradient $G_y$, gradient magnet coils 33 for generating a magnetic field gradient $G_z$ and a power supply source 34 which can be controlled by the process computer 16 in order to power the gradient magnet coils 31, 32 and 33 which are separately controllable. In the embodiment shown, the arrangement in space of the gradient magnet coils 31, 32 and 33 is such that the field direction of the magnetic field gradients $G_x$, $G_y$ and $G_z$ coincides with the direction of the magnetic field $B_0$ and that the gradient directions extend mutually perpendicularly; this is denoted in FIG. 1 by way of three mutually perpendicular axes x, y and z. The device 1 also comprises display means 35, inter alia for displaying a spectrum to be formed from the magnetic resonance signals. The programmed arithmetic means 18 are suitable for determining the spectrum, for example by means of Fourier transformation, from the sampling values 20 obtained, for example via the second transmitter/receiver channel 8. A $^1H$ spectrum of a CH group consists of a doublet $\omega_p \pm \pi J_{CH}$ around a proton resonance frequency $\omega_p = \text{gamma}_p(1-\sigma_p)B_0$, where $J_{CH}$ is a scalar coupling constant between $^1H$ and $^{13}C$ nuclear spins, $\text{gamma}_p$ is a gyromagnetic ratio of protons, and $\sigma_p$ is a shielding constant (the degree of shielding by an electron cloud is determined by the chemical environment of the proton). A $^{13}C$ spectrum of the CH group consists of a doublet $\omega_c \pm \pi J_{CH}$ around a $^{13}C$ resonance frequency $\omega_c = \text{gamma}_c(1-\sigma_c)B_0$, where $\text{gamma}_c$ is a gyromagnetic ratio of the carbon isotope $^{13}C$. The protons and the $^{13}C$ isotope both have a nuclear spin ½ (spin up or spin down). Upon the coupling, the spins "feel" the field of one another, which gives rise to a doublet for $^1H$ as well as $^{13}C$ in the spectra in the given situation. It may be advantageous (signal-to-noise ratio) not to encounter a $^{13}C$ doublet of a CH group in separated form again in the spectrum. This can be achieved by measuring the protons in a so-called decoupled manner ("hard" irradiation on $^1H$). From the spectrum it can then still be deduced from which molecule the CH group originates, because the so-called chemical shift is dependent of the relevant molecule. For a more general description of an NMR device and a general description of the principle of NMR reference is made to the handbook "Practical NMR Imaging" by M. A. Foster and J. M. S. Hutchinson, pp. 1–48, 1987 IRL Press Ltd.

FIG. 2A shows a DEPT pulse sequence in accordance with the invention as a function of time t. A DEPT pulse sequence (Distortionless Enhancement by Polarization Transfer) comprises a first pulse sequence of rf electromagnetic pulses which acts on nuclear spins of a first type of nucleus in a body, and a second pulse sequence of rf electromagnetic pulses which acts on nuclear spins of a second type of nucleus in the body. The first and the second pulse sequence partly coincide. The first pulse sequence, for example for protons as the first type of nucleus comprises a first rf pulse p1 which rotates a magnetization vector in a coordinate system xyz rotating at a proton precessional frequency through an angle of 90° (a so-called 90° pulse), and also comprises a second rf pulse p2 of 180° and a third rf pulse p3 having a variable pulse angle. The second pulse sequence, for example for $^{13}C$ as the second type of nucleus, comprises a fourth, preferably broadband rf pulse p4 which rotates a magnetization vector in a coordinate system x'y'z' rotating at a $^{13}C$ precessional frequency through an angle of 90°, and a fifth, preferably broadband rf pulse p5 of 180°. When the fourth and the fifth pulse are broadband pulses, localization will not vary excessively across the $^{13}C$ spectrum. The pulses p2 and p4 coincide, like the pulses p3 and p5. The pulses p1, p2 and p3 which are applied at the instants t1, t2 and t3 are separated by time intervals $(2J)^{-1}$. In said article by Aue such a DEPT pulse sequence is used for polarization transfer between coupled $^1H$ and $^{13}C$ nuclear spins in a preselected volume part of a body, volume selection taking place by means of VSE (Volume Selective Excitation). In accordance with the invention, volume selection takes place during the application of the rf pulses. During the pulse p1 a first gradient $G_z$ is applied, and during the pulses p2 and p3 the gradients $G_y$ and $G_x$, respectively are applied. The pulses p1, p2 and p3 are applied to the body 5 via the first transmitter/receiver channel 7, the pulses p4 and p5 being applied to the body via the second transmitter/receiver channel 8; the gradients $G_x$, $G_y$ and $G_z$ are applied by means of the respective gradient magnet coils 31, 32 and 33. Around the instant t4 a magnetic resonance signal will arrive via the second transmitter/receiver channel 8, being the $^{13}C$ channel. This comparatively weak $^{13}C$ magnetization will be observed in intensified form as a result of polarization transfer.

In order to illustrate the DEPT pulse sequence in accordance with the invention, FIG. 2B shows a vector description of the DEPT pulse sequence in a double rotating coordinate system, i.e. a coordinate system xyz which rotates around the z-axis at the proton precessional frequency and a coordinate system x'y'z' which rotates around the z'-axis at the $^{13}C$ precessional frequency; the axes z and z' coincide. An equilibrium state is assumed in which a slight excess of nuclear spins in the body is oriented in the direction of the field $B_O$. In the xyz system a for protons this is denoted by the magnetization vector M. Furthermore, by way of example polarization transfer from $^1H$ to $^{13}C$ is considered in molecules with a CH group. For maximum intensification the pulse p3 should then be a 90° pulse. In the xyz system a the equilibrium magnetization M for protons is considered. The 90° pulse p1 on the protons is applied slice-selectively on a slice parallel to the xy plane in that during the pulse p1 the gradient $G_z$ is applied. After termination of the 90° pulse, M has been rotated through 90°; this is shown in the xyz system b. One half of the J-coupled protons "feels" a $^{13}C$ field "up" and the other half "feels" a $^{13}C$ field "down". For the further description it is each time assumed that dephasing/rephasing conditions under the influence of field inhomogeneities are satisfied by the selected succession of the pulses p1, p2 and p3 and the pulses p4 and p5. In the rotating xyz system the nuclear spins do not "feel" the main field $B_O$ but rather the $^{13}C$ fields. The proton nuclear spins dephase in two equal groups due to the different $^{13}C$ fields. After a period of time $(2J)^{-1}s$, a 180° phase difference exists for both groups of protons. This is shown in the xyz systems c and d respectively. At the same time, via the transmitter/receiver channels 7 and 8 the pulses p2 and p4 are slice-selectively applied on a slice parallel to the xz plane, because the gradient $G_y$ is applied during the pulses p2 and p4. For the further description use is made of the double rotating system xyz, x'y'z' for protons and $^{13}C$, respectively, in the CH group. The 90° pulse p4 on the $^{13}C$ nuclear spins orients the $^{13}C$ nuclear spins of the CH group in the same direction as the $^1H$ nuclear spins in the two equal groups. In the interval t2–t3 a state occurs in which for the respective groups the $^1H$ nuclear spins are oriented along the +y axis of the xyz system e with the $^{13}C$ nuclear spins oriented along the −y' axis of the x'y'z' system f and the $^1H$ nuclear spins along the −y axis of the xyz system g with the $^{13}C$ nuclear spins along the +y' axis of the x'y'z' system h. The coupling then no longer exists; in the two groups the nuclear spins are oriented in opposite directions and the coupling is cancelled as if it were. This can be viewed as a mixture of 0-quantum coherence and 2-quantum coherence which is not observable. Except for relaxation, this situation remains. No single spin changes of state can occur; changes of spin state occur in a coupled fashion. The 90° pulse p3 orients the $^1H$ nuclear spins longitudinally (at t3 the rephasing condition for $^1H$ was just satisfied). The pulse p5 serves as a rephasing pulse for the $^{13}C$ nuclear spins; at t4 the rephasing conditions for $^{13}C$ will have been satisfied. In accordance with the invention, the pulses p3 and p5 are applied slice-selectively on a slice parallel to the yz plane, because the gradient $G_x$ is applied during the pulses p3 and p5. Around the instant t4 a magnetic resonance signal s occurs. A 1-quantum coherence of $^{13}C$ can be observed as a $^{13}C$ signal and in comparison with conventional $^{13}C$ spectroscopy is observed in an intensified manner with a gain factor $gamma_p/gamma_c$, i.e. a factor 4 in the case of $^1H$-$^{13}C$ polarization transfer. For a more elaborate quantum theoretical description of the DEPT pulse sequence itself reference is made to U.S. Patent Specification U.S. Pat. No. 4,521,732 and the handbook "Principles of Nuclear Magnetic Resonance in One and Two Dimensions", by Ernst et al, pp. 180–201, Oxford Science Publications 1987. In addition to CH groups, the DEPT pulse sequence can also act on $CH_2$ or $CH_3$ groups or on other coupled spin systems. In the case of a $CH_2$ group, maximum gain occurs when p3 is a 45° pulse, and in the case of a $CH_3$ maximum gain occurs when p3 is a pulse having a pulse angle of approximately 35°. Separate spectra for CH, $CH_2$ and $CH_3$ can be observed from combinations of spectra obtained by means of p3 pulse angles of 45°, 90° and 135°, respectively.

FIG. 3 shows a modified DEPT pulse sequence in accordance with the invention; like FIG. 2A it shows the pulses p1, p2, p3, p4 and p5, the gradients $G_z$, $G_y$ and $G_x$ and the magnetic resonance signal s, be it with modified intervals between the pulses. At the instant t1 the pulse p1 is slice-selectively applied, at the instant t2 the pulse p2 is slice-selectively applied, and at the instant t4 the pulse p3 is slice-selectively applied so that a $^1H$ volume part is selected. The $^{13}C$ pulses p4 and p5 do not coincide with the pulses p2 and p3 as in FIG. 2A, but are applied thereafter at the instants t3 and t5 when no selection gradient is applied. The desired $^{13}C$ resonance signal from the $^1H$ selected volume part can be observed around the instant t6. The interval t3–t4 amounts to $(2J)^{-1}s$. The $^1H$ rephasing interval t2–t4, being equal to the interval t1–t2, may be chosen so as to be longer than $(2J)^{-1}$, like the rephasing interval t5–t6 which is equal to the interval t3–t5 for $^{13}C$. The gradients $G_x$, $G_y$ and $G_z$ are chosen so that gradient compensation occurs. After t1 the time integral over $G_z$ is zero; on both sides of t2 the time interval over $G_y$ is the same and conditions for gradient compensation are also satisfied for $G_x$. For example, in a first example the time integral over $G_x$ is the same on both sides of t4, so that the $^{13}C$ and $^1H$ spins effectively do not "feel" a gradient. $G_x'$ represents an alternative for $G_x$.

Further modifications of the DEPT pulse sequences in accordance with the invention will now be described. The DEPT pulse sequence may be preceded by a saturation pulse applied to the body on $^{13}C$, i.e. the $^{13}C$ magnetization is first rendered zero. The $^{13}C$ signal observed originates exclusively from $^{13}C$ nuclei which are coupled to protons excited in a localized manner. In that case phase cycling of the pulse p3, which could be necessary for eliminating signals of $CH_n$ groups outside the selected volume part, can be dispensed with. The DEPT pulse sequence in accordance with the invention can also be executed by allowing only the pulse p1 to be slice-selective, in combination with further selection via the surface coil 29 of the device. The surface coil 29 for $^{13}C$ pulses should be decoupled from the body coil for $^1H$ pulses. Such a combination of the gradients $G_x$, $G_y$ and $G_z$ is chosen that a gradient is effectively applied which selects a slice extending perpendicularly to the axis of the surface coil 29. The pulses p4 and p5 must be suitably defined in the selected slice, i.e. they must be substantially 90° and 180° pulses in the slice. In the latter case any saturation pulse on the $^{13}C$ nuclear spins is applied by means of the surface coil. Phase cycling and saturation are described in the cited U.S. Patent Specification U.S. No. Pat. 4,521,732.

Many alternatives are feasible without departing from the scope of the invention. The method can be use not only for the described $CH_n$ system but also for, for example $^{31}P$, $^{19}F$ or $^{15}N$ isotopes which are coupled to $^1H$ within a molecule. Moreover, instead of a DEPT pulse sequence for polarization transfer use can be made of, for example an INEPT pulse sequence (Insensitive Nuclei Enhancement by Polarization Transfer). Such a pulse sequence distorts the spectrum, however. In accordance with the invention, the pulses on $^1H$ in INEPT are then rendered slice-selective. INEPT is described, for example in an article by Morris and Freeman "Enhancement of Nuclear Magnetic Resonance by Polarization Transfer", Journal of the Am. Chem. Soc., pp. 760–762, 101:3, Jan. 1979. In an article entitled "In vivo $^{13}C$ Spectroscopy using Polarization Transfer for Sensitivity Enhancement", M. Saner et al., Book of Abstracts of the SMRM 1988, p. 65, a so-called SINEPT sequence (Selective Insensitive Nuclei Enhancement by Polarization Transfer) is described for in vivo spectroscopy. In such SINEPT sequence a resonance signal is obtained by polarization transfer from nuclear spins of a first type of nucleus (e.g. proton) to nuclear spins of a second type of nucleus (e.g. $^{13}C$) utilizing a first sequence directed to exciting the first nucleus type, containing first and second rf pulses (e.g. proton pulses), and a second sequence directed to exciting the second nucleus type, containing a third rf pulse (e.g. $^{13}C$ pulse). According to the present invention this SINEPT sequence can also be adapted for localized spectroscopy by making the proton pulses shown therein slice selective in a first and a second direction by way of gradients and by also making the $^{13}C$ pulse shown therein selective in a third direction by way of a gradient, a volume part thus being selected. Polarization transfer pulse sequences can also be applied in the form of "multiple volume"; during waiting periods for the restoration of equilibrium magnetization other volumes are then measured.

We claim:

1. A method of determining a spectrum from at least one magnetic resonance signal which is generated in a volume part of a body which contains a first and a second type of nucleus and which is arranged in a steady, uniform magnetic field, the resonance signal being obtained by polarization transfer from nuclear spins of the first type of nucleus to nuclear spins of the second type of nucleus in a first and a second pulse sequence of rf electromagnetic pulses which pulse sequences coincide at least partly, the first pulse sequence containing a first, a second and a third rf pulse, the second pulse sequence containing a fourth and a fifth rf pulse, the pulses being separated from one another by waiting periods, characterized in that the volume part is selected during the application of the rf pulses by utilizing at least a first slice selective field gradient which coincides with the first rf pulse.

2. A method as claimed in claim 1, characterized in that the selection of the volume part is further realized by applying a second and a third slice-selective field gradient which coincide with the second and the third rf pulse, respectively, the first, the second and the third field gradient restricting respective excitations of nuclear spins to mutually intersecting slices.

3. A method as claimed in claim 1, characterized in that the selection of the volume part is further takes place by applying the fourth and the fifth rf pulse by means of a surface coil, the first gradient selecting a slice extending perpendicularly to an axis of the surface coil.

4. A method as claimed in claim 1, characterized in that the first and the second pulse sequence together form a DEPT pulse sequence.

5. A method as claimed in claim 1, characterized in that the waiting period elapsing between the fourth and the third rf pulse amounts to an odd number of times $(2J)^{-1}s$, where J is a coupling constant between nuclear spins of the first type and the second type, the other waiting periods elapsing between the rf pulses themselves and the waiting periods elapsing until acquisition of the resonance signal takes place being larger than or equal to the odd number of times $(2J)^{-1}s$.

6. A method as claimed in claim 1, characterized in that the waiting period elapsing between the first and the fourth rf pulse amounts to an odd number of times $(2J)^{-1}s$, the other waiting periods elapsing between the rf pulses themselves and a waiting period elapsing until acquistion of the resonance signal occurs being larger than the odd number of times $(2J)^{-1}$.

7. A method as claimed in claim 1, characterized in that the first and the second pulse sequence together form an INEPT pulse sequence.

8. A method as claimed in claim 1, characterized in that the nuclear spins of the first and the second type of nucleus form a $CH_n$ system, where C is carbon, H is hydrogen and n is an integer positive number.

9. A method as claimed in claim 1, characterized in that, in order to suppress signals originating from coupled nuclei of the first and the second type from outside the selected volume part and from non-coupled nuclei of the second type, phase cycling is applied to at least one rf pulse, the spectrum being determined from resonance signals obtained with opposite phase.

10. A method as claimed in claim 1, characterized in that the first and the second sequence are preceded by an rf saturation pulse which acts on the nuclear spins of the second type followed by a dephasing gradient.

11. A method as claimed in claim 10, characterized in that the saturation pulse is a 90° rf pulse of the adiabatic fast passage type.

12. A method as claimed in claim 1, characterized in that within a longitudinal relaxation time of a magnetization for a volume selected by means of at least one sliceselective field gradient, resonance signals are generated at least in one volume shifted with respect to said volume, by means of rf pulse sequences which correspond to the first and the second pulse sequence.

13. A method of determining a spectrum from at least one magnetic resonance signal which is generated in a body which contains a first and a second type of nucleus and which is arranged in a steady, uniform magnetic field, the resonance signal being obtained by polarization transfer from nuclear spins of the first type of nucleus to nuclear spins of the second type of nucleus in a first and a second pulse sequence of rf electromagnetic pulses, which pulse sequences coincide at least partly, the first pulse sequence containing a first and a second rf pulse and the second pulse sequence containing a third rf pulse, such that the pulse sequences form a so-called SINEPT sequence, characterized in that a volume part of the body is selected during the application of the rf pulses by utilizing a first, second and third slice-selective gradient, the gradient directions not being coincident.

14. A device for determining a spectrum from at least one magnetic resonance signal, which device comprises means for generating a steady, uniform magnetic field, means for generating, utilizing rf electromagnetic pulses, resonance signals in a volume part of a body by polarization transfer from nuclear spin of a first type of nucleus in the body to nuclear spins of a second type of nucleus in the body, means for generating at least one magnetic field gradient, means for receiving, detecting and sampling the magnetic resonance signal and display means for displaying the spectrum, and also comprises processing means which include programmed arithmetic means for determining the spectrum from the sampling values obtained by means of the sampling means, characterized in that the programmed arithmetic means are also suitable for controlling the means for generating the resonance signals so that a selection of the volume part takes place during the application of the rf pulses by utilizing at least a first slice-selective field gradient generated by means of the means for generating the at least one magnetic field gradient.

15. A device as claimed in claim 14, characterized in that the programmed means are also suitable for controlling the means for generating the resonance signals so as to generate, using the means for generating the at least one magnetic field gradient, a second and a third slice-selective field gradient for further selection of the volume part during the application of the rf pulses for generating the resonance signals.

16. A method as claimed in claim 5, characterized in that the selection of the volume part is further realized by applying a second and a third slice-selective field gradient which coincide with the second and the third rf pulse, respectively, the first, the second and the third field gradient restricting respective excitations of nuclear spins to mutually intersecting slices.

17. A method as claimed in claim 4, characterized in that the waiting period elapsing between the first and the fourth rf pulse amounts to an odd number of times $(2J)^{-1}$s, the other waiting periods elapsing between the rf pulses themselves and a waiting period elapsing until acquisition of the resonance signal occurs being larger than the odd number of times $(2J)^{-1}$.

18. A method as claimed in claim 2, characterized in that the nuclear spins of the first and the second type of nucleus form a $CH_n$ system, where C is carbon, H is hydrogen and n is an integer positive number.

19. A method as claimed in claim 2, characterized in that, in order to suppress signals originating from coupled nuclei of the first and the second type from outside the selected volume part and from non-coupled nuclei of the second type, phase cycling is applied to at least one rf pulse, the spectrum being determined from resonance signals obtained with opposite phase.

20. A method as claimed in claim 2, characterized in that the first and the second sequence are preceded by an rf saturation pulse which acts on the nuclear spins of the second type followed by a dephasing gradient.

* * * * *